US012666874B2

(12) United States Patent
Chen et al.

(10) Patent No.: US 12,666,874 B2
(45) Date of Patent: Jun. 23, 2026

(54) PIEZOELECTRIC SENSOR AND DRIVING METHOD THEREFOR, AND HAPTIC FEEDBACK APPARATUS

(71) Applicants: Beijing BOE Technology Development Co., Ltd., Beijing (CN); BOE Technology Group Co., Ltd., Beijing (CN)

(72) Inventors: Yuju Chen, Beijing (CN); Hui Hua, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 743 days.

(21) Appl. No.: 18/043,397

(22) PCT Filed: Mar. 31, 2022

(86) PCT No.: PCT/CN2022/084282
§ 371 (c)(1),
(2) Date: Feb. 28, 2023

(87) PCT Pub. No.: WO2023/184298
PCT Pub. Date: Oct. 5, 2023

(65) Prior Publication Data
US 2024/0298544 A1 Sep. 5, 2024

(51) Int. Cl.
*H10N 30/00* (2023.01)
*H10N 30/20* (2023.01)
(Continued)

(52) U.S. Cl.
CPC ........... *H10N 30/708* (2024.05); *H10N 30/20* (2023.02); *H10N 30/8554* (2023.02);
(Continued)

(58) Field of Classification Search
CPC .. H10N 30/708; H10N 30/20; H10N 30/8554; H10N 30/875; H10N 30/302; H10N 30/802; G06F 3/016; G06F 3/01
See application file for complete search history.

(56) References Cited

U.S. PATENT DOCUMENTS 7,123,111 B2 * 10/2006 Brunson ............ G01C 19/5684
73/504.12
9,105,728 B2 * 8/2015 Hong ................. H10D 30/6733
(Continued)

FOREIGN PATENT DOCUMENTS

CN 101120455 A 2/2008
CN 105204687 A 12/2015
(Continued)

OTHER PUBLICATIONS

Chinese First Office Action, mailed Mar. 31, 2026, from Chinese Patent Application No. 202280000636.9, 20 pages.

*Primary Examiner* — Pedro J Cuevas
(74) *Attorney, Agent, or Firm* — Workman Nydegger

(57) ABSTRACT

Disclosed are a piezoelectric sensor and a driving method therefor, and a haptic feedback apparatus. The piezoelectric sensor includes: a substrate, and a first electrode layer, a piezoelectric film layer and a second electrode layer that are located on the substrate, where the first electrode layer is grounded, and the second electrode layer is coupled to a driving signal end. The driving method includes: loading a grounding signal to the first electrode layer, and loading a driving signal on which a direct current voltage and an alternating current voltage are superimposed to the second electrode layer.

20 Claims, 9 Drawing Sheets

(51) Int. Cl.
 *H10N 30/853* (2023.01)
 *H10N 30/87* (2023.01)
 *H10N 30/88* (2023.01)
 *G06F 3/01* (2006.01)

(52) U.S. Cl.
 CPC ......... *H10N 30/875* (2023.02); *H10N 30/883* (2023.02); *G06F 3/016* (2013.01)

(56) References Cited

U.S. PATENT DOCUMENTS

| | | | | |
|---|---|---|---|---|
| 9,529,436 | B2 * | 12/2016 | Lee | ............................. H04Q 9/00 |
| 10,635,216 | B2 * | 4/2020 | Cheng | ................... G06F 3/0443 |
| 10,663,358 | B2 * | 5/2020 | Madden | ................... G01L 11/00 |
| 10,879,869 | B2 * | 12/2020 | Elsayad | ............... H03H 3/0072 |
| 12,391,037 | B2 * | 8/2025 | Tsuyuki | ............... B41J 2/04548 |
| 12,391,039 | B2 * | 8/2025 | Tsuyuki | ............... B41J 2/14233 |
| 12,397,547 | B2 * | 8/2025 | Tsuyuki | ............... B41J 2/04588 |
| 12,397,550 | B2 * | 8/2025 | Tsuyuki | ................. B41J 2/1408 |
| 12,409,649 | B2 * | 9/2025 | Tsuyuki | ............... B41J 2/04588 |
| 12,409,652 | B2 * | 9/2025 | Tsuyuki | ............... B41J 2/04593 |
| 12,459,252 | B2 * | 11/2025 | Tsuyuki | ............... B41J 2/04541 |
| 12,459,253 | B2 * | 11/2025 | Tsuyuki | ............... B41J 2/04581 |
| 12,515,468 | B2 * | 1/2026 | Tsuyuki | ................. B41J 29/377 |
| 2005/0104675 | A1 * | 5/2005 | Brunson | ............ G01C 19/5684 331/108 C |
| 2005/0210988 | A1 * | 9/2005 | Amano | ................... H10N 39/00 438/52 |
| 2009/0194830 | A1 * | 8/2009 | Ransley | ............... H03H 9/2463 257/415 |
| 2010/0125988 | A1 | 5/2010 | Nakamura et al. | |
| 2014/0027758 | A1 * | 1/2014 | Hong | ................. H10D 30/6733 257/E29.095 |
| 2015/0130770 | A1 | 5/2015 | Takatori | |
| 2016/0139668 | A1 * | 5/2016 | Lee | ............................ H04Q 9/00 340/407.1 |
| 2017/0155036 | A1 | 6/2017 | Kubota et al. | |
| 2018/0038745 | A1 * | 2/2018 | Madden | ................... G01L 11/00 |
| 2018/0120938 | A1 | 5/2018 | Frescas et al. | |
| 2018/0175746 | A1 * | 6/2018 | Van Den Ende | ...... H10N 30/88 |
| 2019/0262865 | A1 | 8/2019 | Mehdizadeh et al. | |
| 2019/0324581 | A1 * | 10/2019 | Cheng | ..................... H03M 1/12 |
| 2021/0359182 | A1 | 11/2021 | Cao et al. | |
| 2022/0299759 | A1 * | 9/2022 | Tatebe | .................. H10N 30/302 |
| 2024/0109298 | A1 * | 4/2024 | Tsuyuki | ................. B41J 29/377 |
| 2024/0109300 | A1 * | 4/2024 | Tsuyuki | ............... B41J 2/14233 |
| 2024/0109301 | A1 * | 4/2024 | Tsuyuki | ............... B41J 2/04548 |
| 2024/0109302 | A1 * | 4/2024 | Tsuyuki | ............... B41J 2/14233 |
| 2024/0109310 | A1 * | 4/2024 | Tsuyuki | ............... B41J 2/04541 |
| 2024/0109311 | A1 * | 4/2024 | Tsuyuki | ............... B41J 2/04515 |
| 2024/0109312 | A1 * | 4/2024 | Tsuyuki | ............... B41J 2/14201 |
| 2024/0109313 | A1 * | 4/2024 | Tsuyuki | ............... B41J 2/14233 |
| 2024/0109314 | A1 * | 4/2024 | Tsuyuki | ............... B41J 2/14233 |
| 2024/0109355 | A1 * | 4/2024 | Tsuyuki | ................. B41J 29/377 |
| 2024/0114796 | A1 * | 4/2024 | Nakamura | ........... H10N 30/704 |
| 2024/0114797 | A1 * | 4/2024 | Kobayashi | ........ H10N 30/8554 |
| 2024/0114801 | A1 * | 4/2024 | Nakamura | ......... H10N 30/8554 |
| 2024/0157397 | A1 * | 5/2024 | Tadaki | ................... G01S 7/5208 |
| 2024/0276884 | A1 * | 8/2024 | Wang | ................... H10N 30/871 |

FOREIGN PATENT DOCUMENTS

| | | |
|---|---|---|
| CN | 106662899 A | 5/2017 |
| CN | 106896556 A | 6/2017 |
| CN | 107017334 A | 8/2017 |
| CN | 110347264 A | 10/2019 |
| CN | 210575960 U | 5/2020 |
| CN | 111386613 A | 7/2020 |
| CN | 111769080 A | 10/2020 |
| CN | 112113732 A | 12/2020 |
| CN | 112230791 A | 1/2021 |
| CN | 112271951 A | 1/2021 |
| CN | 113220166 A | 8/2021 |
| CN | 113875011 A | 12/2021 |
| JP | 2018026445 A | 2/2018 |
| WO | 2011077667 A1 | 6/2011 |
| WO | 2020108017 A1 | 6/2020 |

* cited by examiner

Driving signal (V)

PIEZOELECTRIC SENSOR AND DRIVING METHOD THEREFOR, AND HAPTIC FEEDBACK APPARATUS

This application is a National Stage of International Application No. PCT/CN2022/084282, filed on Mar. 31, 2022, which is hereby incorporated by reference in its entirety.

FIELD

The present disclosure relates to the technical field of haptics, and particularly to a piezoelectric sensor and a driving method therefor, and a haptic feedback apparatus.

BACKGROUND

Haptics is the focus of today's technology development, and the Haptics can enable a terminal to interact with the human body through the sense of touch. The Haptics may be divided into two categories: one is vibration feedback, and the other is tactile reproduction technology.

The surface tactile reproduction technology can perceive characteristics of objects through touch of a screen by a bare finger, realize efficient and natural interaction on multimedia terminals, has great research value, and thus has been widely concerned by domestic and foreign researchers. In the physical sense, the surface tactile sense is the effect of the surface roughness of the object on the surface of the skin (fingertip), and different friction forces are formed due to different surface structures. Therefore, different haptic/tactile simulations can be realized by controlling the surface friction forces.

SUMMARY

Embodiments of the present disclosure provide a piezoelectric sensor and a driving method therefor, and a haptic feedback apparatus. A specific solution is as follows.

According to a driving method for a piezoelectric sensor provided in an embodiment of the present disclosure, the piezoelectric sensor includes: a substrate, and a first electrode layer, a piezoelectric film layer and a second electrode layer that are located on the substrate, where the first electrode layer is grounded, and the second electrode layer is coupled to a driving signal end. The driving method includes: loading a grounding signal to the first electrode layer, and loading a driving signal on which a direct current voltage and an alternating current voltage are superimposed to the second electrode layer.

In a possible implementation, in the driving method provided in an embodiment of the present disclosure, the piezoelectric film layer is deformed under an action of an alternating electric field formed between the first electrode layer and the second electrode layer, to generate an acting force, and the acting force satisfies a following formula:

$$F = \mu \cdot [a_0 + a_1 \sin(\omega t)] \cdot d_{33}.$$

Where F is the acting force, $\rho$ is a coefficient, $a_0$ is a voltage value of the direct current voltage, $a_1 \sin(\omega t)$ is a voltage value of the alternating current voltage, $a_1$ is a peak value of a waveform of the driving signal, and $d_{33}$ is a piezoelectric constant.

In a possible implementation, in the driving method provided in an embodiment of the present disclosure, $a_0$ is greater than 0.

In a possible implementation, in the driving method provided in an embodiment of the present disclosure, $a_0 - |a_1| \geq 0$.

In a possible implementation, in the driving method provided in an embodiment of the present disclosure, $a_0 = |a_1|$.

In a possible implementation, in the driving method provided in an embodiment of the present disclosure, the substrate includes a flexible substrate or a glass substrate.

In a possible implementation, in the driving method provided in an embodiment of the present disclosure, a thickness of the piezoelectric film layer is in a range of 1 μm to 10 μm.

In a possible implementation, in the driving method provided in an embodiment of the present disclosure, a density of the piezoelectric film layer is in a range of 95% to 100%.

In a possible implementation, in the driving method provided in an embodiment of the present disclosure, the piezoelectric film layer includes $Pb(Zr, Ti)O_3$, and a ratio relation of atomic percentages of the $Pb(Zr, Ti)O_3$ is as follows:

$$Pb/(Zr + Ti) = 0.9\text{--}1.1, \quad Zr/(Zr + Ti) = 48\%\text{--}53\%.$$

In a possible implementation, in the driving method provided in an embodiment of the present disclosure, a voltage value of the direct current voltage is greater than 0.

In a possible implementation, in the driving method provided in an embodiment of the present disclosure, the voltage value of the direct current voltage is equal to a peak value of the alternating current voltage.

Accordingly, an embodiment of the present disclosure further provides a piezoelectric sensor. The piezoelectric sensor is driven through the driving method provided in any one of embodiments of the present disclosure. The piezoelectric sensor includes: the substrate, and the first electrode layer, the piezoelectric film layer and the second electrode layer that are located on the substrate, where the first electrode layer is grounded, and the second electrode layer is coupled to the driving signal end.

In a possible implementation, the piezoelectric sensor provided in an embodiment of the present disclosure further includes a first barrier layer located between the first electrode layer and the piezoelectric film layer, and the first barrier layer is configured to bar ions of the piezoelectric film layer from diffusing to the first electrode layer.

In a possible implementation, in the piezoelectric sensor provided in an embodiment of the present disclosure, a material of the first barrier layer is Ti.

In a possible implementation, in the piezoelectric sensor provided in an embodiment of the present disclosure, a thickness of the first barrier layer is smaller than 10 nm.

In a possible implementation, in the piezoelectric sensor provided in an embodiment of the present disclosure, a transmittance of the first barrier layer is greater than or equal to 60%.

In a possible implementation, in the piezoelectric sensor provided in an embodiment of the present disclosure, a material of the first barrier layer includes Pt, $HfO_2$, or $LiNbO_3$.

In a possible implementation, the piezoelectric sensor provided in an embodiment of the present disclosure further includes a second barrier layer located between the first barrier layer and the piezoelectric film layer, a material of the second barrier layer is different from that of the first barrier layer, and the second barrier layer is configured to bar ions of the piezoelectric film layer from diffusing to the first electrode layer.

In a possible implementation, in the piezoelectric sensor provided in an embodiment of the present disclosure, a material of the second barrier layer includes $HfO_2$ or $LiNbO_3$.

In a possible implementation, in the piezoelectric sensor provided in an embodiment of the present disclosure, a thickness of the second barrier layer is smaller than 50 nm.

In a possible implementation, the piezoelectric sensor provided in an embodiment of the present disclosure further includes: an organic insulating layer located at a side of the second electrode layer facing away from the substrate, where the organic insulating layer has a first via hole, and an orthographic projection of the first via hole on the substrate and an orthographic projection of the second electrode layer on the substrate overlap each other; an inorganic insulating layer located at a side of the organic insulating layer facing away from the substrate, where the inorganic insulating layer does not overlap at least part of the first via hole; and a wiring layer located at a side of the inorganic insulating layer facing away from the substrate, where the wiring layer includes a wire, and an end of the wire is electrically connected to the second electrode layer through at least part of the first via hole.

In a possible implementation, in the piezoelectric sensor provided in an embodiment of the present disclosure, the inorganic insulating layer covers a side wall of the first via hole and extends to make contact with the second electrode layer.

In a possible implementation, in the piezoelectric sensor provided in an embodiment of the present disclosure, at a same side wall of the first via hole, a contact boundary between the inorganic insulating layer and the second electrode layer is a first boundary, and a contact boundary between the organic insulating layer and the second electrode layer is a second boundary, and a distance between the first boundary and the second boundary is greater than 30% of a thickness of the piezoelectric film layer and smaller than 60% of the thickness of the piezoelectric film layer.

In a possible implementation, in the piezoelectric sensor provided in an embodiment of the present disclosure, the inorganic insulating layer covers a side wall of the first via hole and covers the second electrode layer exposed from the first via hole, a part of the inorganic insulating layer covering the second electrode layer has at least one second via hole, and an end of the wire is electrically connected to the second electrode layer through the first via hole and the second via hole.

In a possible implementation, the piezoelectric sensor provided in an embodiment of the present disclosure further includes: a bonding electrode provided in a same layer as the first electrode layer, where the bonding electrode is provided close to an edge of the substrate, the other end of the wire is electrically connected to the bonding electrode through third via holes provided in the inorganic insulating layer and the organic insulating layer, and the bonding electrode is configured to be connected to the driving signal end.

In a possible implementation, in the piezoelectric sensor provided in an embodiment of the present disclosure, a quantity of the inorganic insulating layer is one.

In a possible implementation, in the piezoelectric sensor provided in an embodiment of the present disclosure, a material of the inorganic insulating layer the inorganic insulating layer includes $SiO_2$, $Al_2O_3$, or $Si_3N_4$.

In a possible implementation, in the piezoelectric sensor provided in an embodiment of the present disclosure, the inorganic insulating layer includes at least two sub-layers that are stacked, and materials of the two sub-layers are different.

In a possible implementation, in the piezoelectric sensor provided in an embodiment of the present disclosure, a material of each of the sub-layers includes $SiO_2$, $Al_2O_3$, or $Si_3N_4$.

In a possible implementation, in the piezoelectric sensor provided in an embodiment of the present disclosure, the wiring layer has a shape of a grid structure, and a material of the wiring layer is Ti/Ni/Au, Ti/Au, or Ti/Al/Ti.

In a possible implementation, in the piezoelectric sensor provided in an embodiment of the present disclosure, a thickness of the inorganic insulating layer is in a range of 100 nm to 300 nm.

Accordingly, an embodiment of the present disclosure further provides a haptic feedback apparatus including the piezoelectric sensor provided in any one of embodiments of the present disclosure.

DETAILED DESCRIPTION OF EMBODIMENTS

Figure 1:
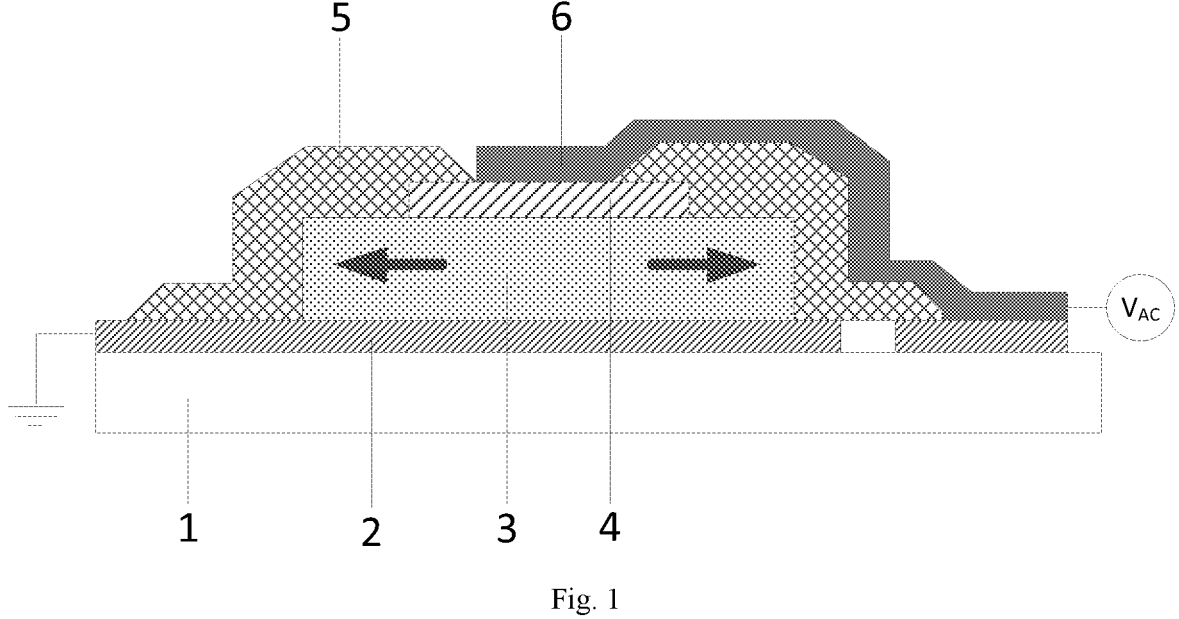
FIG. 1 is a schematic structural diagram of a piezoelectric sensor provided in related art.

For making objectives, technical solutions and advantages of embodiments of the present disclosure clearer, technical solutions of embodiments of the present disclosure will be clearly and completely described below in conjunction with the accompanying drawings in embodiments of the present disclosure. Apparently, embodiments described are some rather than all of embodiments of the present disclosure. Embodiments in the present disclosure and features of embodiments can be combined with each other without conflict. Based on embodiments of the present disclosure, all other embodiments obtained by those of ordinary skill in the art without making creative efforts fall within the scope of protection of the present disclosure.

Unless otherwise defined, technical or scientific terms used in the present disclosure should have ordinary meanings as understood by those of ordinary skill in the art to which the present disclosure belongs. "Including", "comprising", and other similar words used in the present disclosure indicate that elements or objects before the word include elements or objects after the word and their equivalents, without excluding other elements or objects. "Connecting", "connected", and other similar words are not limited to physical or mechanical connections, but can include electrical connections, which can be direct or indirect. "Inside", "outside", "upper", "lower", etc. are only used to indicate a relative positional relation. After an absolute position of the described object changes, the relative positional relation may also change accordingly.

It should be noted that a size and a shape of each figure in the drawings do not reflect a true scale, but only for illustrating the present disclosure. Throughout the drawings, identical or similar reference numerals denote identical or similar elements or elements having identical or similar functions.

A film piezoelectric material has characteristics of a high dielectric constant and transparency, and is very suitable for a sensor structure integrated by a screen. $PbZr_xTi_{1-x}O_3$ (PZT) piezoelectric ceramic is widely used at present because of its excellent piezoelectric properties. As shown in FIG. 1, FIG. 1 shows a structure of a PZT film piezoelectric sensor including a substrate 1, and a first electrode layer 2, a piezoelectric film layer 3, a second electrode layer 4, an insulating layer 5 and a wiring layer 6 that are located on the substrate 1, and the wiring layer 6 is electrically connected to the second electrode layer 4 through a via hole penetrating the insulating layer 5. A fabricating process of the piezoelectric film layer 3 is to perform deposition on the first electrode layer 2 and perform annealing after deposition. Due to influence of a crystal orientation and a thermal expansion coefficient of the first electrode layer 2 and a non-constant thermal expansion coefficient of PZT, internal stress is prone to generation in the piezoelectric film layer 3 after annealing. When the piezoelectric film layer 3 is deposited on the first electrode layer 2 (indium tin oxide (ITO)), if a crystallization and annealing temperature of the piezoelectric film layer 3 is in a range of 500° C. to 700° C., considering influence of the thermal expansion coefficient, there is a tensile stress (as shown by an arrow) on a PZT/ITO interface after decrease to a room temperature. The PZT film piezoelectric sensor is generally driven as follows: a grounding signal is loaded to the first electrode layer 2 and a sine wave signal with a symmetrical signal center of 0 V is loaded to the second electrode layer 4. Since the tensile stress on the PZT/ITO interface greatly influences operation of the PZT film piezoelectric sensor (actuator), if the sine wave signal with the symmetrical signal center of 0 V is still loaded to the second electrode layer 4, the PZT film piezoelectric sensor cannot work effectively.

In view of this, an embodiment of the present disclosure provides a driving method for a piezoelectric sensor. As shown in FIGS. 2-7, the piezoelectric sensor includes: a substrate 1, and a first electrode layer 2, a piezoelectric film layer 3 and a second electrode layer 4 that are located on the substrate 1, where the first electrode layer 2 is grounded, and the second electrode layer 4 is coupled to a driving signal end.

Figure 6:
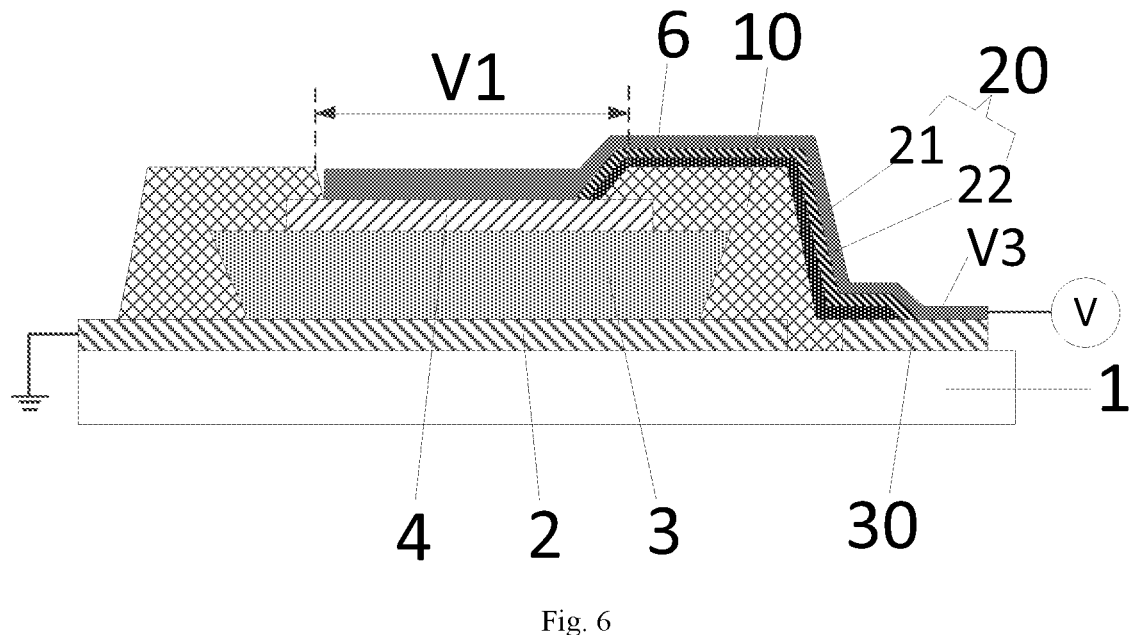
FIG. 6 is a schematic structural diagram of yet another piezoelectric sensor provided in an embodiment of the present disclosure.
Figure 7:
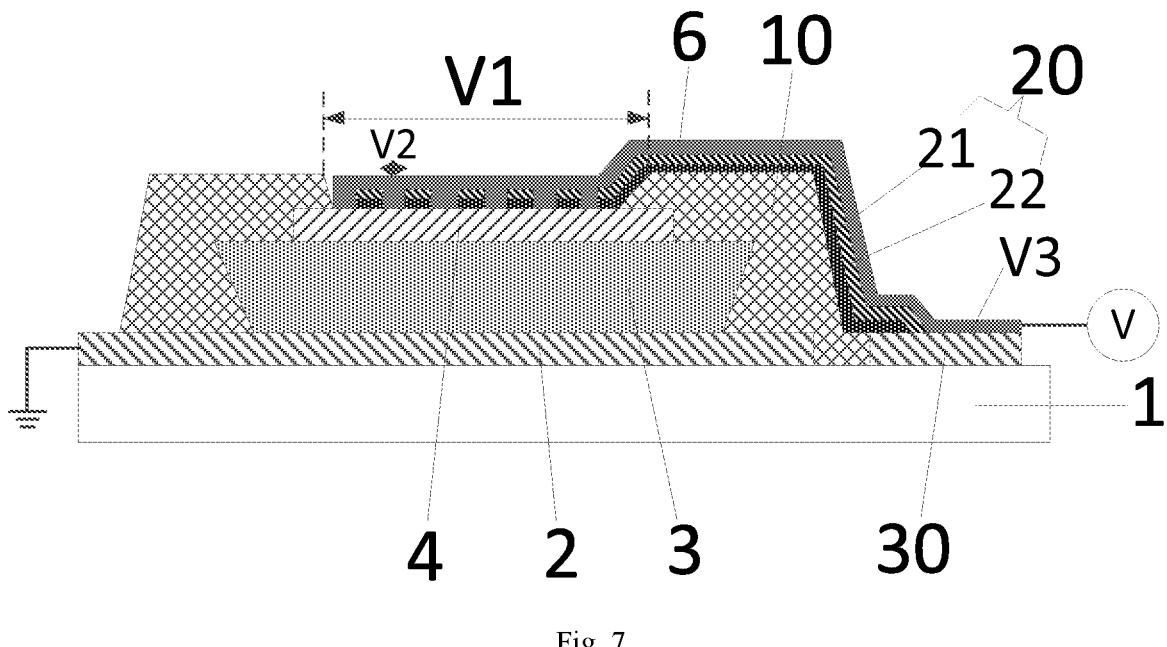
FIG. 7 is a schematic structural diagram of still another piezoelectric sensor provided in an embodiment of the present disclosure.
Figure 8:
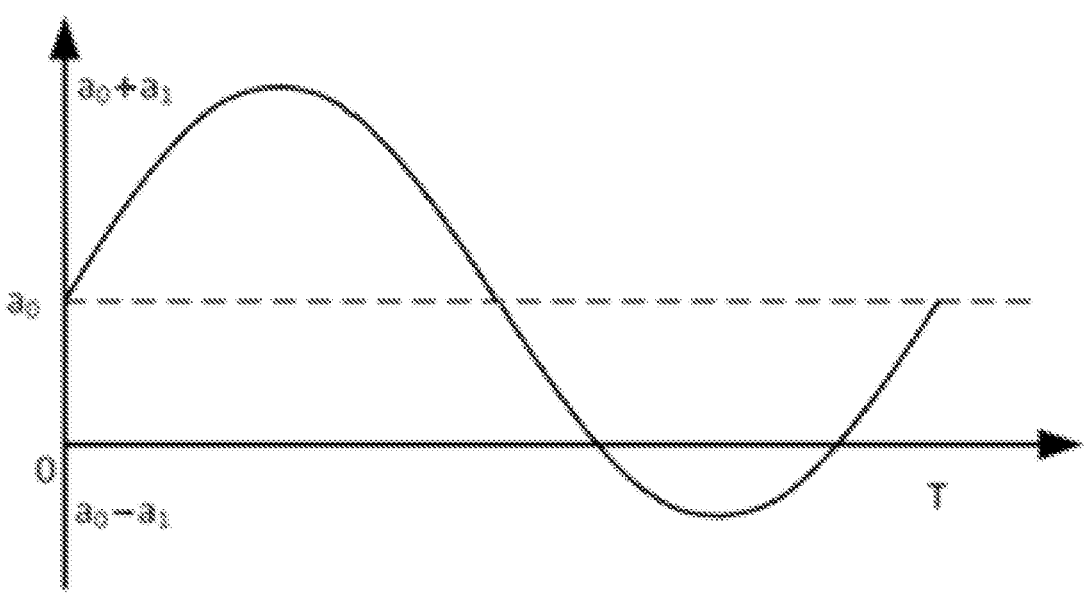
FIG. 8 is a schematic diagram of a driving signal provided in an embodiment of the present disclosure.

The driving method for the piezoelectric sensor shown in FIGS. 2-7 includes the steps that a grounding signal is loaded to the first electrode layer 2, and a driving signal V on which a direct current voltage $V_{dc}$ and an alternating current voltage $V_{AC}$ are superimposed is loaded to the second electrode layer 4. As shown in FIG. 8, the driving signal V satisfies $V_{dc}=a_0$, and a peak value of the alternating current voltage $V_{AC}$ is $a_1$.

According to the driving method provided in an embodiment of the present disclosure, the driving signal V on which the direct current voltage $V_{dc}$ and the alternating current voltage $V_{AC}$ are superimposed is loaded to the second electrode layer 4 of the piezoelectric sensor, such that the direct current voltage $V_{dc}$ may preferentially orient an electric domain inside the piezoelectric film layer, internal stress inside the piezoelectric film layer may be overcome, further constraint of the substrate 1 may be overcome, the piezoelectric film layer has great vibration displacement under drive of the driving signal V on which the direct current voltage $V_{dc}$ and the alternating current voltage $V_{AC}$ are superimposed, and properties of the piezoelectric sensor may be improved.

It should be noted that in an embodiment of the present disclosure, for example, the grounding signal is loaded to the first electrode layer 2 close to the substrate 1, and the driving signal V on which the direct current voltage $V_{dc}$ and the alternating current voltage $V_{AC}$ are superimposed is loaded to the second electrode layer 4 away from the substrate 1. Certainly, during specific implementation, the grounding signal may also be loaded to the second electrode layer 4 away from the substrate 1, and the driving signal V on which the direct current voltage $V_{dc}$ and the alternating current voltage $V_{AC}$ are superimposed may also be loaded to the first electrode layer 2 close to the substrate 1.

During specific implementation, the substrate 1 provided in an embodiment of the present disclosure may include a flexible substrate (for example, polyimide (PI)) or a glass substrate.

Certainly, during specific implementation, the substrate 1 may further be a substrate made of silicon or $SiO_2$, or a substrate made of sapphire, or a substrate made of a metal wafer, which is not limited herein. Those skilled in the art may provide the substrate 1 according to actual application requirements.

In specific implementation, a fabricating process of the piezoelectric film layer 3 provided in an embodiment of the present disclosure may be a chemical vapor deposition process (CVD), a sputter process or a sol-gel process.

During specific implementation, the piezoelectric film layer 3 provided in an embodiment of the present disclosure may have a thickness in a range of 1 μm to 10 μm.

During specific implementation, the piezoelectric film layer 3 provided in an embodiment of the present disclosure has a density in a range of 95% to 100%.

During specific implementation, a material of the piezoelectric film layer 3 provided in an embodiment of the present disclosure may include $Pb(Zr, Ti)O_3$ (PZT), and a ratio relation of atomic percentages of the $Pb(Zr, Ti)O_3$ is as follows: $Pb/(Zr+Ti)=0.9-1.1$, $Zr/(Zr+Ti)=48\%-53\%$. The piezoelectric film layer 3 formed this way has an excellent high piezoelectric coefficient, such that corresponding piezoelectric characteristics of the piezoelectric sensor are ensured.

During specific implementation, the piezoelectric film layer 3 is not limited to the PZT mentioned above, and may further be at least one of AlN, ZnO, $BaTiO_3$, $PbTiO_3$, $KNbO_3$, $LiNbO_3$, $LiTaO_3$, and $La_3Ga_5SiO_{14}$. The material for fabricating the piezoelectric film layer may be selected according to actual use needs of those skilled in the art, which is not limited herein. When the PZT is used for fabricating the piezoelectric film layer, the high piezoelectric coefficient of the PZT ensures the corresponding piezoelectric characteristics of the piezoelectric sensor, such that the corresponding piezoelectric sensor may be used in a haptic feedback device; and the PZT has a high light transmittance, such that display quality of a display device is not influenced when the PZT is integrated into the display device.

During specific implementation, in the driving method provided in an embodiment of the present disclosure, as shown in FIGS. 2-7, the grounding signal is loaded to the first electrode layer 2, and the driving signal V on which the direct current voltage $V_{dc}$ and the alternating current voltage $V_{AC}$ are superimposed is loaded to the second electrode layer 4, such that an alternating electric field is formed between the first electrode layer 2 and the second electrode layer 4, and the piezoelectric film layer 3 is deformed under the action of the alternating electric field formed between the first electrode layer 2 and the second electrode layer 4, to generate an acting force F. The acting force F satisfies the following formula:

$$F = \mu \cdot [a_0 + a_1 \sin(\omega t)] \cdot d_{33}.$$

Where $\mu$ is a coefficient, $a_0$ is a voltage value of the loaded direct current voltage, $a_1 \sin(\omega t)$ is a voltage value of the loaded alternating current voltage, $a_1$ is a peak value of a waveform of the driving signal, and $d_{33}$ is a piezoelectric constant.

The acting force F may be determined according to a haptic feedback effect required by a user, and then the driving signal V that needs to be loaded to the second electrode layer 4 may be determined according to the acting force F, such that $a_0$ and $a_1$ are determined.

The peak value of the waveform (which is generally a sinusoidal waveform) of the driving signal is a maximum value or a minimum value based on a reference value of 0, and the peak value is a positive value or a negative value. A peak-to-peak value of the waveform of the driving signal is a difference between the maximum value and the minimum value, and the peak-to-peak value is only a positive value. The peak-to-peak value describes a change range of a signal value. A relation between the peak-to-peak value and the peak value is that: the peak value refers to a difference between a highest value or a lowest value of a signal and an average value in a period, the peak value is defined only for signals that are symmetric in an up-down manner, and the peak value is equal to half of the peak-to-peak value.

During specific implementation, in the driving method provided in an embodiment of the present disclosure, as shown in FIG. 8, the voltage value $a_0$ of the direct current voltage $V_{dc}$ is greater than 0. Compared with the related art in which only an alternating current voltage signal is loaded to the second electrode layer 4, according to the driving method provided in an embodiment of the present disclosure, an electric domain inside the piezoelectric film layer 3 may be preferentially oriented, and internal stress inside the piezoelectric film layer 3 may be overcome, such that the piezoelectric film layer 3 has great vibration displacement under drive of the driving signal V on which the direct current voltage $V_{dc}$ and the alternating current voltage $V_{AC}$ are superimposed, and properties of the piezoelectric sensor may be improved.

During specific implementation, in order to further improve the vibration displacement of the piezoelectric film layer, in the driving method provided in an embodiment of the present disclosure, the voltage value $a_0$ of the direct current voltage $V_{dc}$ satisfies: $a_0 - |a_1| \geq 0$.

Figure 9:
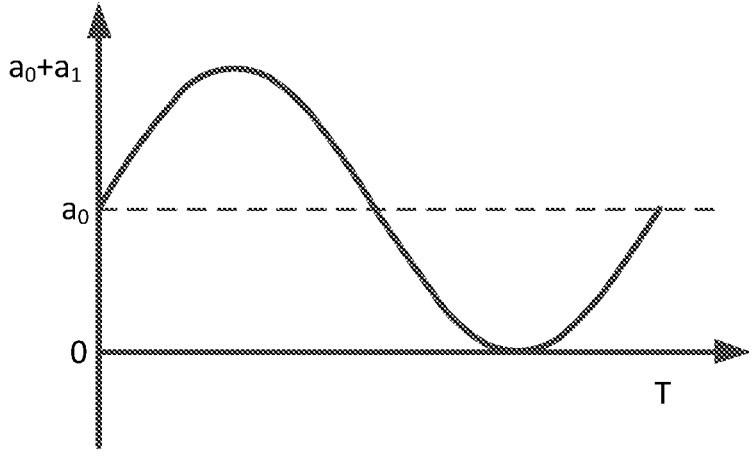
FIG. 9 is a schematic diagram of another driving signal provided in an embodiment of the present disclosure.

During specific implementation, in the driving method provided in an embodiment of the present disclosure, as shown in FIG. 9, when the voltage value $a_0$ of the direct current voltage $V_{dc}$ and the peak value $a_1$ of the alternating current voltage $V_{AC}$ satisfy $a_0 = |a_1|$, an optimal driving effect of the piezoelectric sensor may be obtained, and the vibration displacement of the piezoelectric film layer 3 may be maximized.

Figure 10:
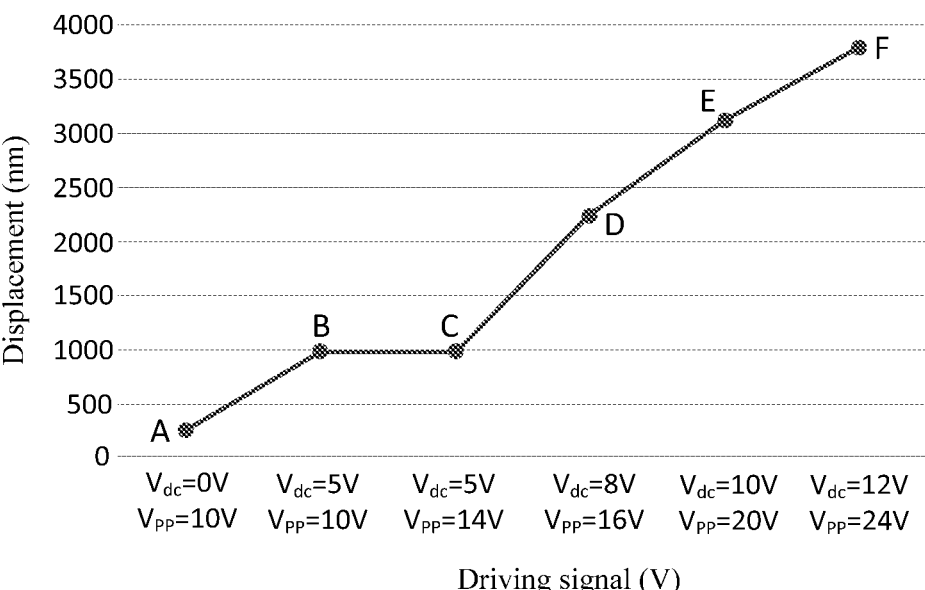
FIG. 10 shows a relation curve between vibration displacement of a piezoelectric sensor and a driving signal loaded to a second electrode layer according to an embodiment of the present disclosure.

As shown in FIG. 10, FIG. 10 shows a relation curve between vibration displacement (nm) of a piezoelectric sensor and a driving signal (V) loaded to a second electrode layer according to an embodiment of the present disclosure, where $V_{PP}$ (Voltage Peak-Peak) is a peak-to-peak voltage. In an embodiment of the present disclosure, when $V_{PP}=2a_1=2a_0$, the vibration displacement of the piezoelectric film layer 3 is great. As shown in FIG. 10, it may be seen that point A indicates that only an alternating current voltage signal is loaded to the second electrode layer 4, point B indicates that a driving signal with a direct current voltage of 5 V and an alternating current voltage signal ($V_{PP}=10$ V) is loaded to the second electrode layer 4 at the same time, point C indicates that a driving signal with a direct current voltage of 5 V and an alternating current voltage signal ($V_{PP}=14$ V) is loaded to the second electrode layer 4 at the same time, point D indicates that a driving signal with a direct current voltage of 8 V and an alternating current voltage signal ($V_{PP}=16V$) is loaded to the second electrode layer 4 at the same time, point E indicates that a driving signal with a direct current voltage of 10 V and an alternating current voltage signal ($V_{PP}=20$ V) is loaded to the second electrode layer 4 at the same time, and point F indicates that a driving signal with a direct current voltage of 12 V and an alternating current voltage signal ($V_{PP}=24$ V) is loaded to the second electrode layer 4 at the same time. When B, D, E and F all satisfy $a_0=a_1$, the vibration displacement of the piezoelectric film layer changes. It may be seen that the piezoelectric film layers corresponding to B, D, E and F have greater vibration displacement compared with the point A where only the alternating current voltage is loaded. The vibration displacement of B and C does not change because $a_0$ corresponding to the point C is smaller than $a_1$. Therefore, the piezoelectric film layer has great vibration displacement only when $a_0=a_1$. As shown in FIG.

Figure 11:
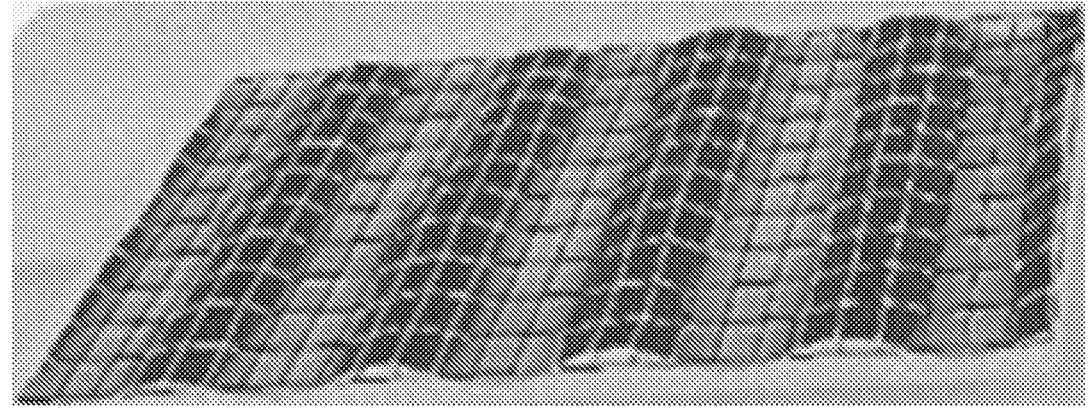
FIG. 11 is a schematic effect diagram of vibration of a piezoelectric sensor.

11, FIG. 11 is a schematic diagram of a vibration effect of a piezoelectric sensor obtained through laser vibration measurement.

To sum up, in an embodiment of the present disclosure, the driving signal on which the direct current voltage and the alternating current voltage are superimposed is loaded to the second electrode layer at the same time, and when the voltage value of the direct current voltage is equal to the peak value $a_1$ of the alternating current voltage $V_{AC}$, the piezoelectric film layer has great vibration displacement, such that performance of the piezoelectric sensor is improved.

A specific structure of a piezoelectric sensor provided in an embodiment of the present disclosure will be described below.

According to the piezoelectric sensor provided in an embodiment of the present disclosure, as shown in FIGS. 2-7, the piezoelectric sensor is driven through the driving method for a piezoelectric sensor mentioned above, such that the piezoelectric sensor may have great vibration displacement. The piezoelectric sensor includes: a substrate 1, and a first electrode layer 2, a piezoelectric film layer 3 and a second electrode layer 4 that are located on the substrate 1, where the first electrode layer 2 is grounded, and the second electrode layer 4 is coupled to a driving signal end.

Figure 2:
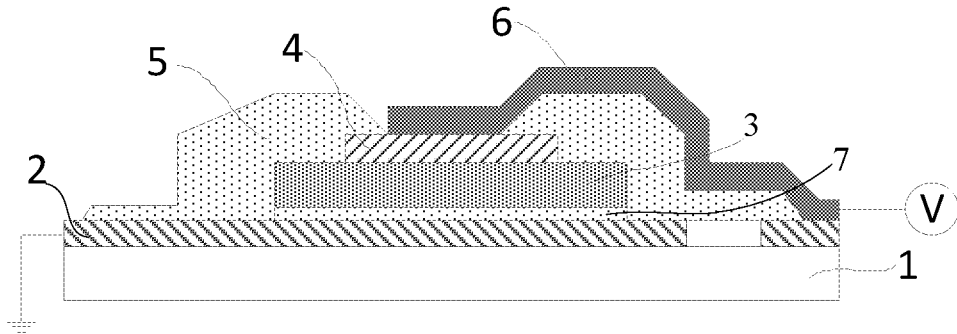
FIG. 2 is a schematic structural diagram of a piezoelectric sensor provided in an embodiment of the present disclosure.

There are various methods for fabricating a piezoelectric film layer (PZT), and the methods include dry coating (a sputter method) and wet coating (a sol-gel method). However, in order to achieve desirable piezoelectric constant characteristics, the PZT material needs to undergo a high-temperature annealing process, which requires PZT grains to grow in air at 550° C.-650° C., to form a desirable solid solution phase. When a vibrator structure is integrated into a display device, in order not to influence display quality of the display device, the vibrator structure needs to use a transparent electrode (for example, ITO) as a base electrode and a growth layer, but there are following problems: because the ITO conducts electricity mainly through oxygen vacancies, and the PZT is a perovskite phase and needs a sufficient grain size to form piezoelectric properties, the PZT needs to undergo high-temperature oxygen annealing. The annealing process may lead to a significant increase in ITO resistance, an increase in line resistance, and a decrease in conductivity, which is not conducive to high-frequency driving of the device. In addition, Pb ions in the PZT have a very small ion radius, so the Pb ions may easily diffuse between oxides. Once the PZT film is directly fabricated on the ITO, it is verified by the inventor of the solution that the Pb ions have diffusion of about 100 nm under different high-temperature annealing processes. The diffusion may not only lead to the increase in ITO resistance, but also lead to loss of the Pb ions in the PZT film layer, such that the perovskite phase is converted into a Pyrochlore phase, the piezoelectric properties of the PZT are reduced, and further properties of a piezoelectric device are reduced. Therefore, as shown in FIG. 2, the piezoelectric sensor provided in an embodiment of the present disclosure further includes a first barrier layer 7 located between the first electrode layer 2 and the piezoelectric film layer 3, and the first barrier layer 7 is configured to bar ions of the piezoelectric film layer 3 from diffusing to the first electrode layer 2.

According to the piezoelectric sensor provided in an embodiment of the present disclosure, the piezoelectric film layer 3 (for example, the PZT) may be formed through dry coating or wet coating. In order to achieve desirable piezoelectric constant characteristics, the PZT material needs to undergo a high-temperature annealing process, which requires PZT grains to grow in air at 550° C.-650° C., to form a desirable solid solution phase. The first electrode layer 2 (for example, the ITO) conducts electricity mainly through oxygen vacancies, and in the high-temperature annealing process, oxygen in the PZT may diffuse to oxygen vacancy positions of ITO, such that the ITO resistance may increase (conductivity may decrease), which is not conducive to high-frequency driving of a device. Moreover, a radius of the Pb ions is small, and the Pb ions may easily diffuse between oxides. The diffusion may not only lead to increase in ITO resistance, but also lead to loss of the Pb ions in a PZT film layer, such that a phase is converted into Pyrochlore, and further the piezoelectric properties of the PZT are reduced. According to an embodiment of the present disclosure, the first barrier layer 7 is provided between the piezoelectric film layer 3 and the first electrode layer 2, and the first barrier layer 7 may bar ions (for example, O and Pb) of the piezoelectric film layer 3 from diffusing to the first electrode layer 2, such that when the piezoelectric film layer 3 subsequently undergoes a high-temperature annealing process, Pb may be barred from diffusing into the ITO while the ITO conductivity may be maintained, a perovskite crystal phase of the PZT may be easily maintained, and the piezoelectric properties of the piezoelectric film layer 3 may be improved.

It should be noted that the first electrode layer may include a plurality of first patterned electrodes, or may have an entire-surface structure; and the second electrode layer includes a plurality of second patterned electrodes.

During specific implementation, the first electrode layer 2 and the second electrode layer 4 may be made of indium tin oxide (ITO), or indium zinc oxide (IZO), or certainly, may be made of one of a Ti—Au alloy, a Ti—Al—Ti alloy, or a Ti—Mo alloy. In addition, the first electrode layer and the second electrode layer may also be made of one of Ti, Au, Ag, Mo, Cu, W, or Cr. Those skilled in the art may provide the first electrode layer and the second electrode layer according to actual application requirements, which are not limited herein.

During specific implementation, in the piezoelectric sensor provided in an embodiment of the present disclosure, as shown in FIG. 2, a material of the first barrier layer 7 may be Ti, because the Ti has stable characteristics, and is a metal that is less likely to be oxidized at a high temperature, and the first barrier layer 7 formed has a relatively small thickness.

During specific implementation, in order to ensure transparency of the piezoelectric sensor, in the piezoelectric sensor provided in an embodiment of the present disclosure, a thickness of the first barrier layer is smaller than 10 nm, for example, 9 nm, 8 nm, 7 nm, 6 nm, 5 nm, 4 nm, etc.

During specific implementation, in the piezoelectric sensor provided in an embodiment of the present disclosure, as shown in FIG. 2, a transmittance of the first barrier layer 7 is greater than or equal to 60%, for example, 60%, 70%, 80%, 90%, etc. In this way, when the piezoelectric sensor of the present disclosure is integrated into the display device, the display quality of the display device is not influenced.

During specific implementation, in the piezoelectric sensor provided in an embodiment of the present disclosure, as shown in FIG. 2, a material of the first barrier layer 7 may further include Pt, HfO$_2$, or LiNbO$_3$, which is not limited herein.

Figure 3:
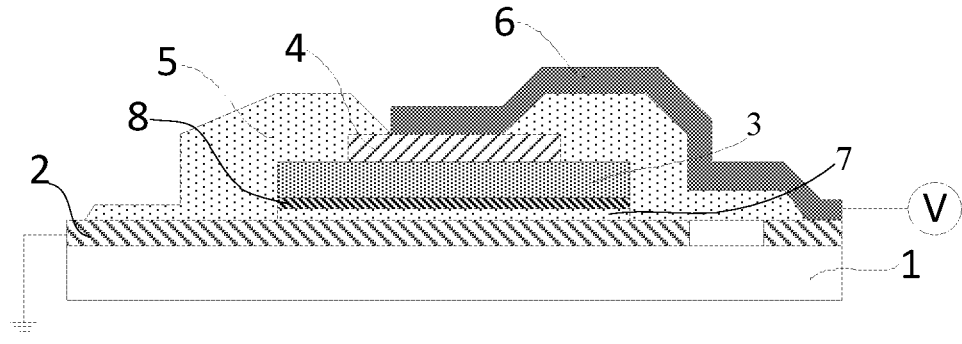
FIG. 3 is a schematic structural diagram of another piezoelectric sensor provided in an embodiment of the present disclosure.

During specific implementation, the first barrier layer 7 made of Ti may bar most of ions in the PZT from diffusing to the first electrode layer 2, in order to further improve the conductivity of the first electrode layer 2 and the piezoelectric properties of the piezoelectric film layer 3, as shown in FIG. 3, the piezoelectric sensor provided in an embodiment of the present disclosure further includes a second barrier layer 8 located between the first barrier layer 7 and the piezoelectric film layer 3, a material of the second barrier layer 8 is different from that of the first barrier layer 7, and the second barrier layer 8 is configured to further bar ions of the piezoelectric film layer 3 from diffusing to the first electrode layer 2.

During specific implementation, in the piezoelectric sensor provided in an embodiment of the present disclosure, a material of the second barrier layer may be $HfO_2$ or $LiNbO_3$.

When the material of the second barrier layer is $HfO_2$, $HfO_2$ may be used as a seed layer for film growth. If an orientation is needed, the seed layer is needed, such that when a piezoelectric material layer is subsequently fabricated on the second barrier layer, a crystal orientation of growth of the piezoelectric material layer may be related to an orientation of the second barrier layer, which is conducive to the crystal orientation of the growth of the piezoelectric material layer and improves the piezoelectric properties of the piezoelectric material layer.

When the material of the second barrier layer is $LiNbO_3$ (LNO for short), $LiNbO_3$ may also be used as a seed layer. $LiNbO_3$ is conductive, so compared with $HfO_2$, $LiNbO_3$ may further improve the conductivity while avoiding diffusion of Pb and O.

When the piezoelectric material layer (for example, the PZT) is fabricated through a dry or wet process, there are more or less micropores generated in the process. Once there are holes in the PZT, the first electrode layer and the second electrode layer are connected to cause short circuit. Because the LNO is a conductor, compared with using the LNO as the second barrier layer, using $HfO_2$ as the second barrier layer may better avoid the short circuit between the first electrode layer and the second electrode layer due to insulation of $HfO_2$ when holes are generated in the PZT layer.

Therefore, $HfO_2$ or $LiNbO_3$ may be selected as the second barrier layer according to actual requirements.

During specific implementation, in the piezoelectric sensor provided in an embodiment of the present disclosure, a thickness of the second barrier layer is smaller than 50 nm, for example, 40 nm, 30 nm, 20 nm, and 10 nm.

Figure 12:
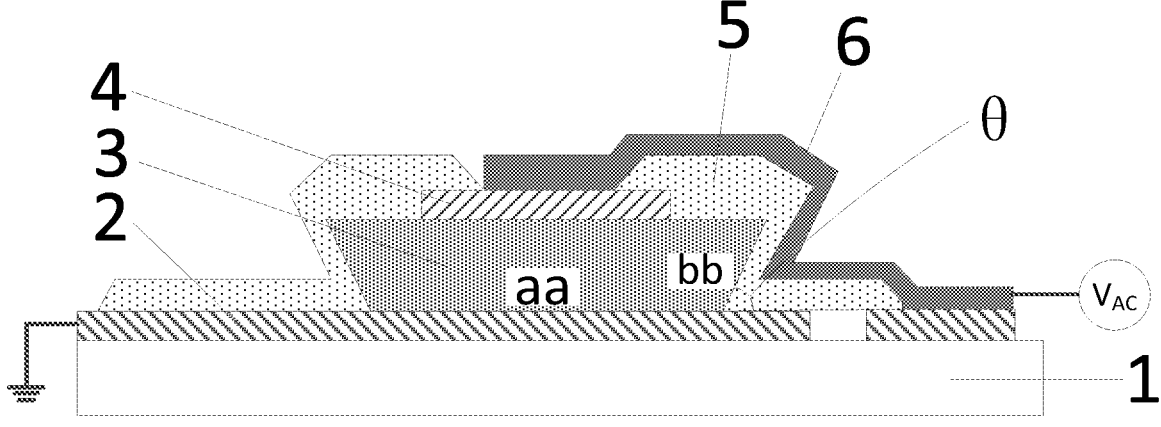
FIG. 12 is a schematic structural diagram of a piezoelectric sensor provided in the related art.
Figure 13:
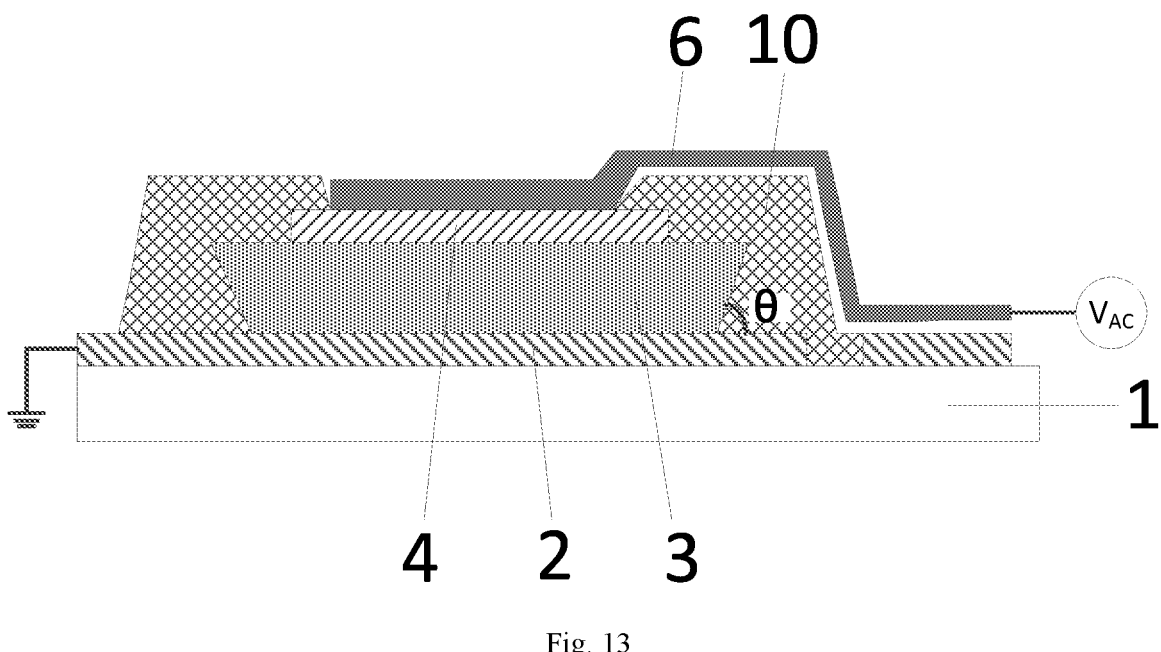
FIG. 13 is a schematic structural diagram of another piezoelectric sensor provided in the related art.

As shown in FIG. 12, FIG. 12 shows a structure of a piezoelectric sensor in related art. The piezoelectric sensor includes a substrate 1, and a first electrode layer 2, a piezoelectric film layer 3, a second electrode layer 4, an insulating layer 5 and a wiring layer 6 that are located on the substrate 1 and sequentially stacked, and the wiring layer 6 is electrically connected to the second electrode layer 4 through a via hole penetrating the insulating layer 5. The insulating layer 5 is located at a side of the second electrode layer 4 facing away from the substrate 1, and the wiring layer 6 is located at a side of the insulating layer 5 facing away from the substrate 1; the wiring layer 6 is electrically connected to the second electrode layer 4 through a via hole penetrating the insulating layer 5, and a material of the insulating layer 5 is an inorganic material. The first electrode layer 2 is grounded, and the wiring layer 6 is connected to a driving signal end. In order to avoid short circuit, the insulating layer 5 needs to be provided between the second electrode layer 4 and the wiring layer 6 for isolation. However, a fabricating process of the piezoelectric film layer 3 (for example, a PZT material) generally includes dry etching and wet etching. The piezoelectric film layer 3 includes a bottom edge aa that is in contact with the first electrode layer 2 and a side edge bb that is adjacent to the bottom edge aa. When a wet etching process is used, the piezoelectric film layer 3 easily forms a chamfered structure (that is, an included angle θ is formed between the side edge bb and the first electrode layer 2), and θ is generally in a range of 60° to 85°. When the piezoelectric film layer 3 is fabricated through a dry etching process, the included angle θ between the side edge bb and the first electrode layer 2 is generally in a range of 85° to 95°. It should be noted that in an embodiment of the present disclosure, for example, when the piezoelectric film layer 3 is fabricated through a wet etching process, the included angle θ between the side edge bb and the first electrode layer 2 is generally in a range of 60° to 85°. In FIG. 12, the chamfered structure (θ) of the piezoelectric film layer 3 cannot be filled with the inorganic insulating layer 5 between the wiring layer 6 and the second electrode layer 4, which easily leads to a risk of wire breakage of the wiring layer 6. Therefore, as shown in FIG. 13, the chamfered structure (θ) of the piezoelectric film layer 3 is filled with an organic insulating layer 10 between the wiring layer 6 and the second electrode layer 4. However, due to poor adhesion between the organic insulating layer 10 and the wiring layer 6, falling of the wiring layer 6 is easily caused (as shown in FIG. 13). Therefore, during specific implementation, in the piezoelectric sensor provided in an embodiment of the present disclosure, as shown in FIGS. 4-7, the piezoelectric sensor further includes: an organic insulating layer 10 located at a side of the second electrode layer 4 facing away from the substrate 1, where the organic insulating layer 10 has a first via hole V1, and an orthographic projection of the first via hole V1 on the substrate 1 and an orthographic projection of the second electrode layer 4 on the substrate 1 overlap each other; an inorganic insulating layer 20 located at a side of the organic insulating layer 10 facing away from the substrate 1, where the inorganic insulating layer 20 does not overlap at least part of the first via hole V1; and a wiring layer 6 located at a side of the inorganic insulating layer 20 facing away from the substrate 1, where the wiring layer 6 includes a wire, and an end of the wire is electrically connected to the second electrode layer 4 through at least part of the first via hole V1.

In an embodiment of the present disclosure, in FIGS. 4-7, the inorganic insulating layer 20 is provided between the wiring layer 6 and the organic insulating layer 10. Adhesion between the inorganic insulating layer 20 and the wiring layer 6 is strong, such that the inorganic insulating layer 20 may solve a problem of poor adhesion between the organic insulating layer 10 and the wiring layer 6 on the basis that the organic insulating layer 10 solves a chamfering problem of the piezoelectric film layer 3, and falling of the wiring layer 6 may be prevented.

Figure 4:
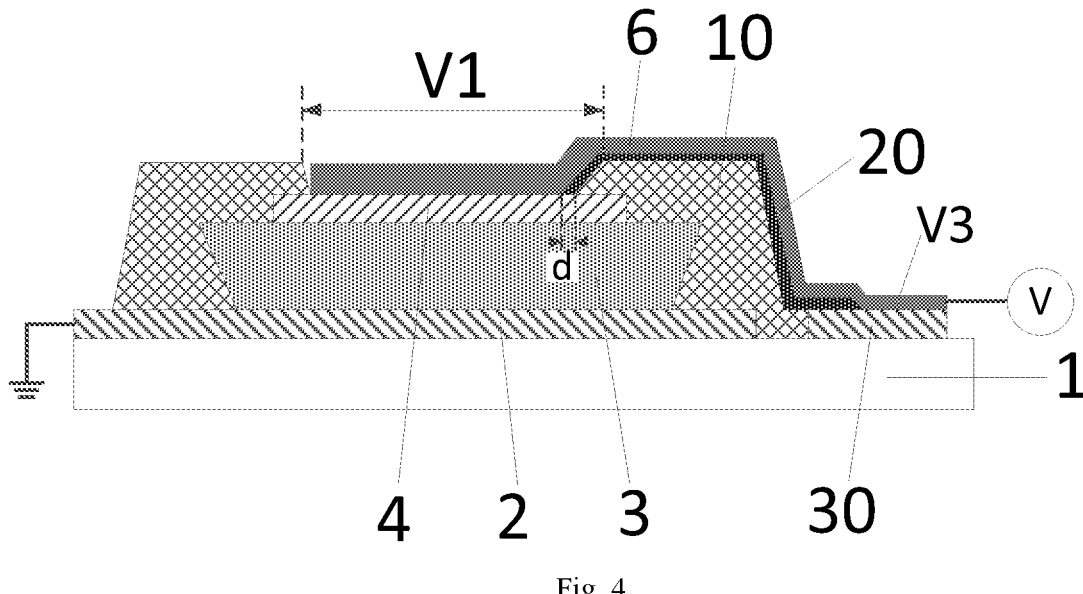
FIG. 4 is a schematic structural diagram of yet another piezoelectric sensor provided in an embodiment of the present disclosure.

During specific implementation, in the piezoelectric sensor provided in an embodiment of the present disclosure, as shown in FIGS. 4 and 6, the inorganic insulating layer 20 covers a side wall of the first via hole V1 and extends to make contact with the second electrode layer 4. Due to influence of the fabricating process, a cross section of the first via hole V1 in a thickness direction of the piezoelectric sensor is generally an inverted trapezoidal structure, and the inorganic insulating layer 20 is provided to cover the side wall of the first via hole V1 and extend to make contact with the second electrode layer 4, such that the inorganic insulating layer 20 has a buffering effect in the first via hole V1, and the wiring layer 6 fabricated later may be prevented from being broken at the first via hole V1.

During specific implementation, in the piezoelectric sensor provided in an embodiment of the present disclosure, as shown in FIGS. 4 and 6, at the first via hole V1, a contact boundary between the inorganic insulating layer 20 and the second electrode layer 4 is a first boundary, and a contact boundary between the organic insulating layer 10 and the second electrode layer 4 is a second boundary, and a distance d between the first boundary and the second boundary may be greater than 30% of a thickness of the piezoelectric film layer 3 and smaller than 60% of the thickness of the piezoelectric film layer 3. A thickness of the piezoelectric film layer 3 is generally in a range of 1 μm to 10 μm, and for example, the thickness of the piezoelectric film layer 3 is 1 μm, 2 μm, 3 μm, 4 μm, 5 μm, 6 μm, 7 μm, 8 μm, 9 μm, or 10 μm. For example, if the thickness of the piezoelectric film layer 3 is 3 μm, d is greater than 0.9 μm and smaller than 1.8 μm; if the thickness of the piezoelectric film layer 3 is 6 μm, d is greater than 1.8 μm and smaller than 3.6 μm; and if the thickness of the piezoelectric film layer 3 is 9 μm, d is greater than 2.7 μm and smaller than 5.4 μm.

Figure 5:
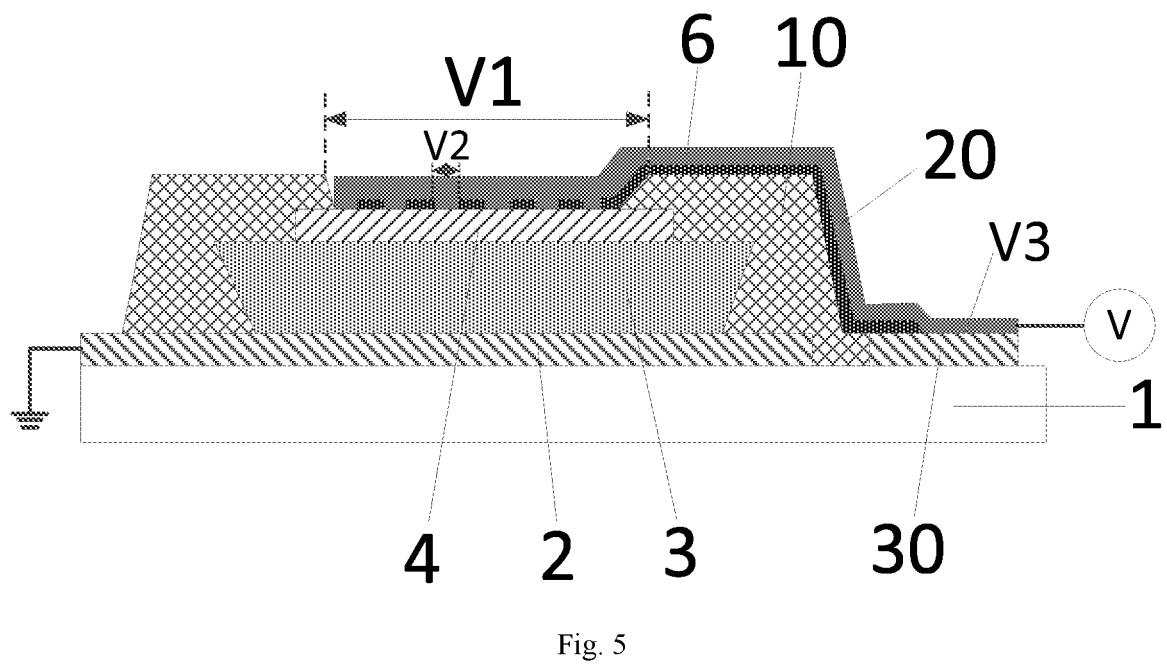
FIG. 5 is a schematic structural diagram of yet another piezoelectric sensor provided in an embodiment of the present disclosure.

During specific implementation, a material of the wiring layer is generally metal, a material of the second electrode layer is generally indium tin oxide (ITO), and adhesion between the metal and the ITO is poor. In order to prevent a problem that the wiring layer and the second electrode layer cannot transmit electrical signals due to peeling, in the piezoelectric sensor provided in an embodiment of the present disclosure, as shown in FIGS. 5 and 7, the inorganic insulating layer 20 covers the side wall of the first via hole V1 and covers the second electrode layer 4 exposed from the first via hole V1, a part of the inorganic insulating layer 20 covering the second electrode layer 4 has at least one second via hole V2, and an end of the wire (6) is electrically connected to the second electrode layer 4 through the first via hole V1 and the second via hole V2. In this way, parts of the wiring layer 6 and the exposed second electrode layer 4 make contact with the inorganic insulating layer 20, and part of the wiring layer is electrically connected to the second electrode layer 4 through the first via hole V1 and the second via hole V2. Due to strong adhesion between the wiring layer 6 and the inorganic insulating layer 20, the adhesion between the wiring layer 6 and the second electrode layer 4 may be improved on the basis of ensuring an electrical connection between the wiring layer 6 and the second electrode layer 4.

During specific implementation, as shown in FIGS. 4-7, the piezoelectric sensor provided in an embodiment of the present disclosure further includes: a bonding electrode 30 provided in a same layer as the first electrode layer 2. The bonding electrode 30 is provided close to an edge of the substrate 1, the other end of the wire (6) is electrically connected to the bonding electrode 30 through third via holes V3 provided in the inorganic insulating layer 20 and the organic insulating layer 10, and the bonding electrode 30 is configured to be connected to the driving signal end. A driving signal on which a direct current voltage and an alternating current voltage are superimposed is loaded to the second electrode layer 4 through a driving voltage input end, such that an alternating electric field may be formed between the first electrode layer 2 and the second electrode layer 4, and frequency of the alternating electric field is the same as that of an alternating current voltage signal. Under the action of the alternating electric field, the piezoelectric film layer 3 is deformed and generates a vibration signal, and frequency of the vibration signal is the same as that of the alternating electric field. When the frequency of the vibration signal is close to or equal to natural frequency of the substrate, the substrate resonates, amplitude of vibration is enhanced, and a haptic feedback signal is generated. When a finger touches a surface of the substrate, change of a friction force may be obviously felt. In actual application, the friction force on the surface of the substrate may be adjusted by resonance between the piezoelectric film layer and the substrate, such that texture reproduction of an object is achieved on the surface of the substrate.

Figure 14:
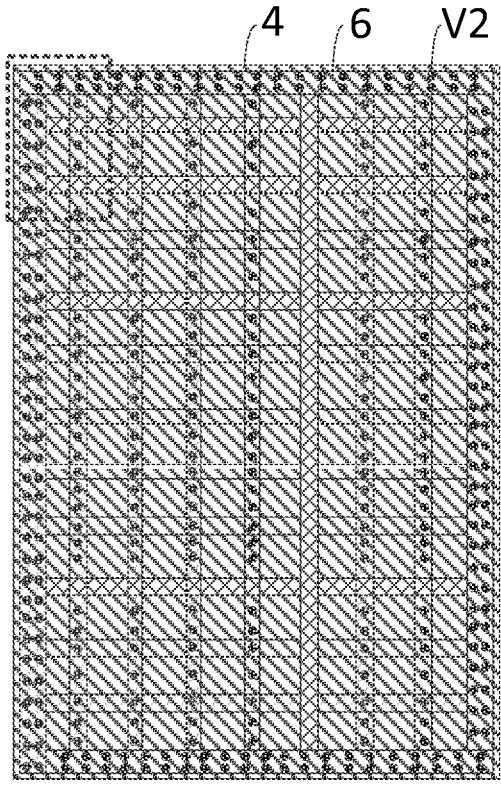
FIG. 14 is a schematic diagram of a top view of part of film layers in a piezoelectric sensor.
Figure 15:
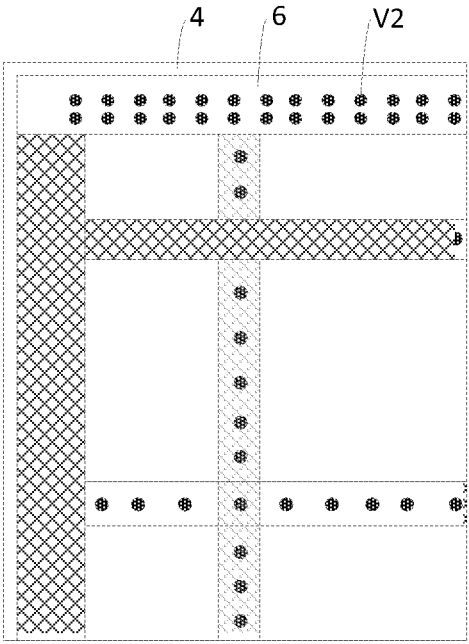
FIG. 15 is a partially enlarged schematic diagram of FIG. 14.

During specific implementation, in order to more clearly show that the wiring layer in FIG. 5 is electrically connected to the second electrode layer 4 through the second via hole V2, as shown in FIGS. 14 and 15, FIG. 14 is a schematic diagram of a top view of the second electrode layer 4, the second via hole V2 and the wiring layer 6, and FIG. 15 is an enlarged schematic diagram of a dotted box in FIG. 14. The piezoelectric sensor is generally combined with a display device to achieve haptic reproduction. In order to improve a transmittance of the piezoelectric sensor, the wiring layer 6 may have a shape of a grid structure, and the inorganic insulating layer 20 below corresponding to each grid line of the grid structure may be provided with a plurality of second via holes V2, such that the wiring layer 6 is electrically connected to the second electrode layer 4 through the second via holes V2.

During specific implementation, in a vibration panel provided in an embodiment of the present disclosure, a material of the wiring layer may be Ti/Ni/Au, where Ti may be 10 nm, Ni may be 400 nm, and Au may be 100 nm; alternatively, the material of the wiring layer may be Ti/Au, where Ti may be 10 nm, and Au may be 400 nm; and alternatively, the material of the wiring layer may be Ti/Al/Ti, where Ti may be 10 nm, and Al may be 300 nm.

During specific implementation, in the piezoelectric sensor provided in an embodiment of the present disclosure, as shown in FIGS. 4 and 5, a quantity of the inorganic insulating layer 20 may be one. A material of the inorganic insulating layer 20 may include, but not limited to, at least one of $SiO_2$, $Al_2O_3$, or $Si_3N_4$.

During specific implementation, in a touch panel provided in an embodiment of the present disclosure, as shown in FIGS. 6 and 7, the inorganic insulating layer 20 may include at least two sub-insulating layers (21 and 22) that are stacked, and materials of the two sub-insulating layers (21 and 22) are different. In this way, according to a material of the wiring layer 6, a material of the outermost sub-insulating layer 22 may use a material having desirable adhesion to the wiring layer 6. A material of each of the sub-insulating layers (21 and 22) may include, but not limited to, $SiO_2$, $Al_2O_3$, or $Si_3N_4$. For example, if a material of the wiring layer 6 is Cr, a material of the outermost sub-insulating layer 22 may be $Si_3N_4$.

During specific implementation, in the vibration panel provided in an embodiment of the present disclosure, as shown in FIGS. 4-7, a thickness of the inorganic insulating layer 20 may be in a range of 100 nm to 300 nm, and for example, the thickness of the inorganic insulating layer 20 is 100 nm, 200 nm, or 300 nm.

In order to reduce a risk of short circuit, with reference to FIGS. 2-7, an edge of the second electrode layer 4 may be retracted relative to an edge of the piezoelectric film layer 3. In specific implementation, a retraction amount of the edge of the second electrode layer 4 relative to the edge of the piezoelectric film layer 3 is greater than or equal to 100 μm and smaller than or equal to 500 μm. For example, the retraction amount may be 150 μm.

In order to further reduce the risk of short circuit, the edge of the piezoelectric film layer 3 may be retracted relative to the edge of the first electrode layer 2.

It should be noted that FIG. 2 provided in an embodiment of the present disclosure only provides the first barrier layer 7 on the basis of FIG. 1, FIG. 3 only provides the first barrier layer 7 and the second barrier layer 8 on the basis of FIG. 1, and FIGS. 4-7 provide the inorganic insulating layer between the organic insulating layer and the wiring layer on the basis of FIG. 13. Certainly, during specific implementation, a solution of providing the barrier layers and a solution of providing the organic insulating layer and the inorganic insulating layer may be superimposed, that is, the first barrier layer and/or the second barrier layer may be provided between the first electrode layer and the piezoelectric film layer, and meanwhile, the inorganic insulating layer and the organic insulating layer may be provided between the second electrode layer and the wiring layer, which are selected and provided according to actual requirements.

The inventor of the solution drives several piezoelectric sensors having different structures provided in embodiments of the present disclosure by using the driving method for a piezoelectric sensor mentioned above.

Five types of piezoelectric sensors provided in embodiments of the present disclosure have structures as follows.

1, Glass/ITO/PZT/ITO, and thicknesses of respective film layers are 500 um/500 nm/2000 nm/250 nm.

2, Glass/ITO/Ti/PZT/ITO, and thicknesses of respective film layers are 500 um/250 nm/5 nm-10 nm/2000 nm/250 nm.

3, Glass/ITO/LNO/PZT/ITO, and thicknesses of respective film layers are 500 um/250 um/100 nm-200 nm/2000 nm/250 nm.

4, Glass/ITO/Pt/PZT/ITO, and thicknesses of respective film layers are 500 um/250 nm/100 nm/2000 nm/250 nm.

5, Glass/ITO/HfO$_2$/PZT/ITO, and thicknesses of respective film layers are 500 um/10 nm-20 nm/2000 nm/250 nm.

In the above structures, Glass represents the substrate, two ITOs represent the first electrode layer and the second electrode layer respectively, PZT represents the piezoelectric film layer, and each of Ti, LNO, Pt and HfO$_2$ represents the first barrier layer.

Figure 16:
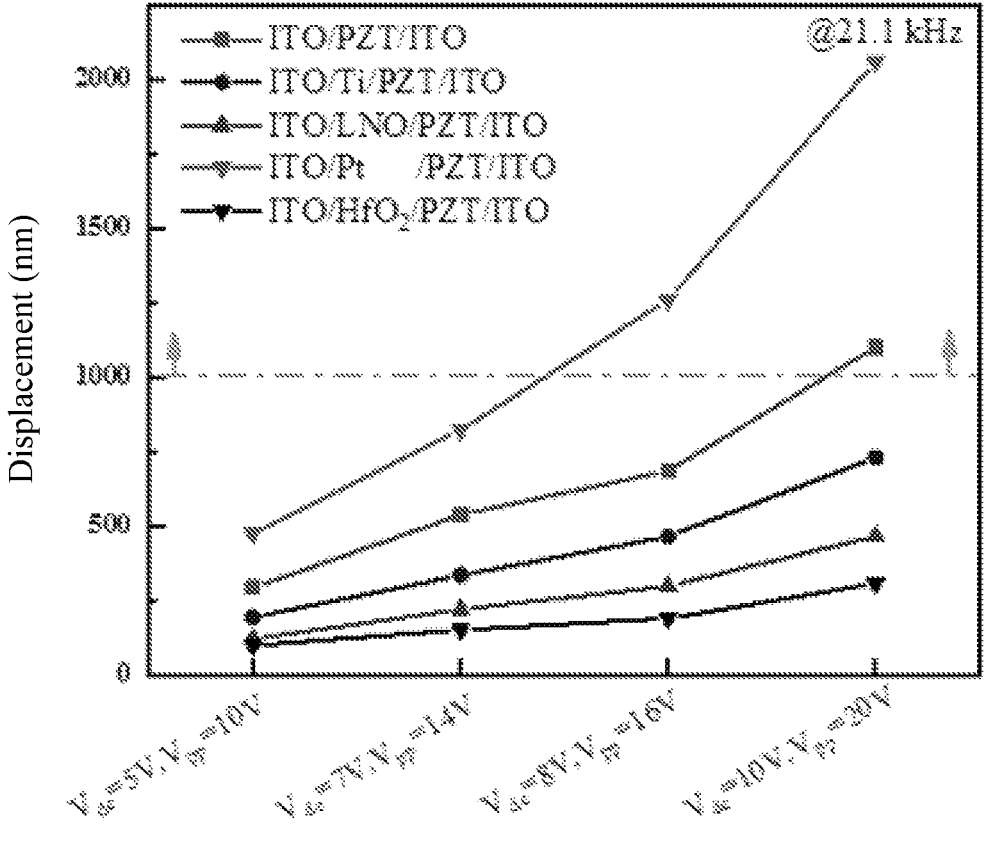
FIG. 16 is a curve graph of vibration displacement-driving signal of 5 types of piezoelectric sensors under different driving conditions.

When the five types of piezoelectric sensors are driven, the first electrode layer is grounded, a signal on which the direct current voltage and the alternating current voltage are superimposed is loaded to the second electrode layer, and a voltage value of the direct current voltage is equal to a peak value of the alternating current voltage. As shown in FIG. 16, FIG. 16 is a curve graph of vibration displacement-driving signal of 5 types of piezoelectric sensors under different driving conditions, it may be seen that when the signal on which the direct current voltage and the alternating current voltage are superimposed is loaded to the second electrode layer provided in an embodiment of the present disclosure to drive the piezoelectric sensor, the piezoelectric film layer may obtain great vibration displacement, such that performance of the piezoelectric sensor is improved.

For example, taking the piezoelectric sensor in FIG. 4 provided in an embodiment of the present disclosure as an example, fabricating the piezoelectric sensor shown in FIG. 4 may include following steps.

Firstly, a first electrode layer, a piezoelectric film material layer and a second electrode layer are sequentially formed on a substrate.

The first electrode layer may include a plurality of first patterned electrodes, or may have an entire-surface structure; and the second electrode layer includes a plurality of second patterned electrodes.

Then, the piezoelectric film material layer is polarized.

A strong direct current electric field is applied to the piezoelectric film material layer, such that dipole moments in the piezoelectric film material layer are arranged orderly, to form a pre-polarization characteristic. Polarization generally means that the first electrode layer is grounded (0 V/GND) and a direct current voltage is loaded to the second electrode layer, and the direct current voltage may be loaded at a room temperature of 120° C., where the direct current voltage is greater 15 V and polarization time longer than 5 minutes. Through a polarization process, properties of a PZT moving film layer may be further improved.

Then, the polarized piezoelectric film material layer is patterned to form a piezoelectric film layer between the first electrode layer and the second electrode layer.

The patterned piezoelectric film layer may be formed through dry coating (a sputter method) or wet coating (a sol-gel method).

Then, an organic insulating layer is formed at a side of the second electrode layer facing away from the substrate, where the organic insulating layer has a first via hole, and an orthographic projection of the first via hole on the substrate and an orthographic projection of the second electrode layer on the substrate overlap each other.

Then, an inorganic insulating layer is formed at a side of the organic insulating layer facing away from the substrate, where the inorganic insulating layer does not overlap at least part of the first via hole.

Then, a wiring layer is formed at a side of the inorganic insulating layer facing away from the substrate, where the wiring layer is electrically connected to the second electrode layer through at least part of the first via hole.

It should be noted that during fabricating of structures of other piezoelectric sensors provided in embodiments of the present disclosure, the piezoelectric film material layer needs to be polarized before the patterned piezoelectric film layer is formed.

The piezoelectric sensor provided in an embodiment of the present disclosure may be applied to medical treatment, automotive electronics, motion tracking systems and other fields. The piezoelectric sensor is especially suitable for the field of wearable devices, monitoring and medical treatment outside or implanted in human bodies, or fields of electronic skin of artificial intelligence. The piezoelectric sensor may be applied to brake pads, keyboards, mobile terminals, game consoles, vehicles and other apparatuses that may generate vibration and mechanical characteristics.

Based on the same inventive concept, an embodiment of the present disclosure further provides a haptic feedback apparatus, which includes the piezoelectric sensor provided in embodiments of the present disclosure. A problem solving principle of the haptic feedback apparatus is similar to that of the piezoelectric sensor, so reference may be made to implementation of the piezoelectric sensor for implementation of the haptic feedback apparatus, which will not be repeated herein. The haptic feedback apparatus may be any product or component having a display or touch function, such as a mobile phone, a tablet computer, a television, a display, a notebook computer, a digital photo frame, or a navigator.

During specific implementation, the haptic feedback apparatus provided in an embodiment of the present disclosure may further include other functional structures that are familiar to those skilled in the art, which will not be described in detail herein.

During specific implementation, the haptic feedback apparatus may be combined with a touch screen, and a touch position of a human body may be determined through the touch screen, such that corresponding vibration waveform, amplitude and frequency may be generated, and human-computer interaction may be achieved. For another example, the touch position of the human body is determined through the piezoelectric sensor in the haptic feedback apparatus, such that the corresponding vibration waveform, amplitude and frequency may be generated, and human-computer interaction may be achieved. Certainly, the haptic feedback apparatus may further be applied to medical treatment, automotive electronics, motion tracking systems and other fields according to actual needs, which will not be described in detail herein.

Embodiments of the present disclosure provide the piezoelectric sensor and a driving method therefor, and a haptic feedback apparatus. The driving signal on which the direct current voltage and the alternating current voltage are superimposed is loaded to the second electrode layer of the piezoelectric sensor, such that the direct current voltage may preferentially orient the electric domain inside the piezoelectric film layer, internal stress inside the piezoelectric film layer may be overcome, further constraint of the substrate may be overcome, the piezoelectric film layer has great vibration displacement under drive of the driving signal on which the direct current voltage and the alternating current voltage are superimposed, and properties of the piezoelectric sensor may be improved.

Although embodiments of the present disclosure have been described, those skilled in the art can make additional changes and modifications to embodiments once they learn the basic inventive concept. Therefore, the appended claims are intended to be interpreted as including embodiments and all changes and modifications falling within the scope of the present disclosure.

Apparently, those skilled in the art can make various modifications and variations to embodiments of the present disclosure without departing from the spirit and scope of embodiments of the present disclosure. In this way, if the modifications and variations of embodiments of the present disclosure fall within the scope of the claims of the present disclosure and their equivalent technologies, the present disclosure is also intended to include these modifications and variations.

What is claimed is:

1. A driving method for a piezoelectric sensor, wherein the piezoelectric sensor comprises: a substrate, and a first electrode layer, a piezoelectric film layer and a second electrode layer that are located on the substrate, wherein the first electrode layer is grounded, and the second electrode layer is coupled to a driving signal end; and the driving method comprises: loading a grounding signal to the first electrode layer, and loading a driving signal on which a direct current voltage and an alternating current voltage are superimposed to the second electrode layer.

2. The driving method according to claim 1, wherein the piezoelectric film layer is deformed under an action of an alternating electric field formed between the first electrode layer and the second electrode layer, to generate an acting force, and the acting force satisfies a following formula:

$$F = \mu \cdot [a_0 + a_1 \sin(\omega t)] \cdot d_{33},$$

wherein F is the acting force, $\mu$ is a coefficient, $a_0$ is a voltage value of the direct current voltage, $a_1 \sin(\omega t)$ is a voltage value of the alternating current voltage, $a_1$ is a peak value of a waveform of the driving signal, and $d_{33}$ is a piezoelectric constant.

3. The driving method according to claim 2, wherein $a_0$ is greater than 0.

4. The driving method according to claim 3, wherein $a_0 - |a_1| \geq 0$.

5. The driving method according to claim 4, wherein $a_0 = |a_1|$.

6. The driving method according to claim 1, wherein the substrate comprises a flexible substrate or a glass substrate.

7. The driving method according to claim 1, wherein a thickness of the piezoelectric film layer is in a range of 1 $\mu$m to 10 $\mu$m.

8. The driving method according to claim 1, wherein a density of the piezoelectric film layer is in a range of 95% to 100%.

9. The driving method according to claim 1, wherein the piezoelectric film layer comprises Pb(Zr, Ti)O$_3$, and a ratio relation of atomic percentages of the Pb(Zr, Ti)O$_3$ is as follows:

$$Pb/(Zr + Ti) = 0.9\text{--}1.1, \quad Zr/(Zr + Ti) = 48\%\text{--}53\%.$$

10. A piezoelectric sensor, wherein the piezoelectric sensor is driven through the driving method according to claim 1; and the piezoelectric sensor comprises: the substrate, and the first electrode layer, the piezoelectric film layer and the second electrode layer that are located on the substrate, wherein the first electrode layer is grounded, and the second electrode layer is coupled to the driving signal end.

11. The piezoelectric sensor according to claim 10, further comprising a first barrier layer located between the first electrode layer and the piezoelectric film layer, wherein the first barrier layer is configured to bar ions of the piezoelectric film layer from diffusing to the first electrode layer;

wherein a material of the first barrier layer is Ti, or the material of the first barrier layer comprises Pt, HfO$_2$ or LiNbO$_3$;

wherein a thickness of the first barrier layer is smaller than 10 nm;

wherein a transmittance of the first barrier layer is greater than or equal to 60%.

12. The piezoelectric sensor according to claim 11, further comprising a second barrier layer located between the first barrier layer and the piezoelectric film layer, wherein a material of the second barrier layer is different from that of the first barrier layer, and the second barrier layer is configured to bar ions of the piezoelectric film layer from diffusing to the first electrode layer;

wherein a material of the second barrier layer comprises HfO$_2$ or LiNbO$_3$;

wherein a thickness of the second barrier layer is smaller than 50 nm.

13. The piezoelectric sensor according to claim 10, further comprising:

an organic insulating layer located at a side of the second electrode layer facing away from the substrate, wherein the organic insulating layer has a first via hole, and an orthographic projection of the first via hole on the substrate and an orthographic projection of the second electrode layer on the substrate overlap each other;

an inorganic insulating layer located at a side of the organic insulating layer facing away from the substrate, wherein the inorganic insulating layer does not overlap at least part of the first via hole; and a wiring layer located at a side of the inorganic insulating layer facing away from the substrate, wherein the wiring layer comprises a wire, and an end of the wire is electrically connected to the second electrode layer through at least part of the first via hole.

14. The piezoelectric sensor according to claim 13, wherein the inorganic insulating layer covers a side wall of the first via hole and extends to make contact with the second electrode layer;

wherein at a same side wall of the first via hole, a contact boundary between the inorganic insulating layer and the second electrode layer is a first boundary and a contact boundary between the organic insulating layer and the second electrode layer is a second boundary, and a distance between the first boundary and the second boundary is greater than 30% of a thickness of the piezoelectric film layer and smaller than 60% of the thickness of the piezoelectric film layer.

15. The piezoelectric sensor according to claim 14, further comprising: a bonding electrode provided in a same layer as the first electrode layer, wherein the bonding electrode is provided close to an edge of the substrate, the other end of the wire is electrically connected to the bonding electrode through third via holes provided in the inorganic insulating layer and the organic insulating layer, and the bonding electrode is configured to be connected to the driving signal end.

16. The piezoelectric sensor according to claim 13, wherein the inorganic insulating layer covers a side wall of the first via hole and covers the second electrode layer exposed from the first via hole, a part of the inorganic insulating layer covering the second electrode layer has at least one second via hole, and an end of the wire is electrically connected to the second electrode layer through the first via hole and the second via hole.

17. The piezoelectric sensor according to claim 13, wherein a quantity of the inorganic insulating layer is one;

wherein a material of the inorganic insulating layer comprises $SiO_2$, $Al_2O_3$, or $Si_3N_4$.

18. The piezoelectric sensor according to claim 13, wherein the inorganic insulating layer comprises at least two sub-layers that are stacked, and materials of the two sub-layers are different;

wherein a material of each of the sub-layers comprises $SiO_2$, $Al_2O_3$, or $Si_3N_4$.

19. The piezoelectric sensor according to claim 13, wherein the wiring layer has a shape of a grid structure, and a material of the wiring layer is Ti/Ni/Au, Ti/Au, or Ti/Al/Ti;

wherein a thickness of the inorganic insulating layer is in a range of 100 nm to 300 nm.

20. A haptic feedback apparatus, comprising a piezoelectric sensor, wherein the piezoelectric sensor is driven through the driving method according to claim 1, and the piezoelectric sensor comprises: the substrate, and the first electrode layer, the piezoelectric film layer and the second electrode layer that are located on the substrate, wherein the first electrode layer is grounded, and the second electrode layer is coupled to the driving signal end.

\* \* \* \* \*